United States Patent [19]
Leung

[11] Patent Number: 5,719,880
[45] Date of Patent: Feb. 17, 1998

[54] ON-CHIP OPERATION FOR MEMORIES

[75] Inventor: Yu-Ying Jackson Leung, Sugar Land, Tex.

[73] Assignee: Texas Instruments Incorporated, a Delaware Corporation, Dallas, Tex.

[21] Appl. No.: 710,606

[22] Filed: Sep. 20, 1996

[51] Int. Cl.$^6$ ............................................ G06F 11/00
[52] U.S. Cl. .................. 371/22.5; 371/21.1; 365/230.02
[58] Field of Search ..................... 365/230.02, 185.12, 365/189.02, 236; 371/22.5, 21.1, 22.6

[56] References Cited

U.S. PATENT DOCUMENTS 5,329,471  7/1994  Swobodz et al. ..................... 364/578
5,491,660  2/1996  Ashmore, Jr. ..................... 365/230.02

*Primary Examiner*—Vincent P. Canney
*Attorney, Agent, or Firm*—Theodore D. Lindgren; Robby T. Holland; Richard L. Donaldson

[57] ABSTRACT

The memory control this invention includes a microprogram-read-only-memory (CROM) containing micro-instructions for operation of an integrated-circuit memory, a program counter multiplexer (PCM) to select instructions from the control-read-only-memory, a micro-instruction decoder with BILBO control (MID/BC), a test input multiplexer (TIM) to test control signals, an optional status output register (SOR) to generate control signals, and a subroutine stack (SS) to allow function calls. A program counter (PC) takes an index signal from the micro-instruction decoder with BILBO control (MID/BC) and a signal from the program counter multiplexer (PCM), and from those signal, generates a next microcode address. Complex program, erase, and compaction instructions for the integrated-circuit memory are implemented using a relatively small number of control-read-only-memory locations and using a relatively small surface area on the memory chip. Control instructions are easily modified to compensate for process and structure enhancements are made during the production lifetime of an integrated-circuit memory.

14 Claims, 3 Drawing Sheets

ON-CHIP OPERATION FOR MEMORIES

BACKGROUND OF THE INVENTION

This invention relates to a nonvolatile, integrated-circuit memory array such as a flash erasable, electrically programmable read-only-memory (flash EPROM or flash EEPROM) array. In particular, this invention relates to on-chip control of operations such as programming, erasing and threshold-voltage compaction of such memories.

Flash EPROMs of the type discussed herein are described in: (a) "A Single Transistor EEPROM cell and its implementation in a 512K CMOS EEPROM", S. Mukherjee et al., IEDM 1985 (p. 616–619) and (b) "A 90ns 100K Erase/Program Cycle Megabit Flash Memory", V. Kynett et al., ISSCC 1989 (p. 140–141). The topic of reference (a) is also discussed in U.S. Pat. No. 4,698,787.

Early flash memories require complex commands from a separate-chip microprocessor when performing write and erase operations. For example, instead of a simple erase command from the microprocessor, the microprocessor is required to furnish the length of the erase pulse and, in addition, a test routine to check for proper erasure. While the commands for write and erase operations may be changed to accommodate manufacturing variations among chips of the same type, those changes must be programmed by system users. Those programming changes require additional system manufacturing time. In addition, after exceeding the maximum number of program/erase cycles, replacement of flash memories is made difficult because replacement memories having different characteristics require re-programming of the separate-chip microprocessor, which is often burdensome for an end-user.

As flash memory technology evolves, the demand by end users for increasing ease of installation, use and replacement has led to the development of automated control instructions for programming and erasing FLASH memories. The automated program and erase control instructions are embedded in the write state machine (WSM) architecture of such flash EPROMs. The codes for those control instructions are stored in a control-read-only-memory (CROM) in the write state machine. With the automated program and erase instructions embedded in the write state machine, the external-to-chip microprocessor need only furnish a simple "erase" command. That is, it is not necessary for the external-to-chip microprocessor to furnish pulse length directions or other complex information necessary to perform the write and erase operations. The embedded program and erase control instructions allow the memory manufacturer to alter the program and erase control instructions to compensate for manufacturing variations.

Because of the limited space outside of the memory array, it is not practical to form a microprocessor on a memory chip if that microprocessor has most of the features of an external-to-memory-chip microprocessor.

Prior-art implementations of embedded program and erase control instructions generally fall into three groups, random-logic implementation, programmed logic-array-based implementation (PLA-based implementation), and microcode ROM-based implementation.

The first group, random-logic implementation, generally consumes a large surface area on a memory chip, such as a flash EPROM chip. Using random-logic implementation, both the program and erase/compaction instructions are generally limited to simple operations because of the required high number of logic gates needed to implement those instructions.

The second group, programmed-logic-array-based implementation, also generally consumes a large chip area. Typically, a separate programmed logic array is dedicated to each mode of operation when used to implement an automated instruction. This requires a minimum of four programmed logic arrays for a flash EPROM chip—one for the control operation, one for the program operation, one for the erase operation, and one for the compaction operation. While more complex instructions can be implemented using this second group rather than the first group, the state density is not high. In addition, instruction changes to compensate for manufacturing variations are generally difficult to make.

The third group, microcode ROM-based implementation, provides maximum flexibility and relatively smaller chip area than the other two implementation groups, especially for complicated operations or instructions. This type of implementation includes a control-read-only-memory (CROM), containing micro-instructions and control data, a program counter multiplexer (PCM) to select instructions from the control-read-only-memory (CROM), a micro-instruction decoder (MID), an input test input multiplexer (TIM) to test control signals, an optional status output register (SOR) to generate control signals, and an optional subroutine stack (SS) to allow function calls. The microcode ROM-based implementation of the type discussed herein are described in U.S. Pat. No. 5,491,660 issued Feb. 13, 1996 to Benjamin H. Ashmore, Jr., assigned to Texas Instruments Incorporated and in U.S. Pat. No. 5,359,570.

Due to the "fixed" syntax of the microcodes and the nature of the on-chip operations or procedures of the prior-art devices, about two-thirds of the seventy-five bits used for prior-art overall program codes are not used for actual control of the internal circuit operation of the flash EPROM. Instead, those bits are used for such things as branching, testing and other controls internal to the microsequencer. In addition, only about one third of the fifty-eight control bits of the prior-art flash EPROMs switch at the same time because the program, erase and compaction operations are completely independent of each other. As a result, only one-third of the output field is effectively used, while two-thirds is idle, therefore wasted.

There is a need for reducing the size of the control-read-only-memory used in the third group (the microcode ROM-based implementation), particularly if the reduction can be accomplished without degrading the performance or speed of the control.

SUMMARY OF THE INVENTION

The memory control this invention is an improved version of the invention disclosed in the above-referenced U.S. Pat. No. 5,491,660. The improved memory control includes a control-read-only-memory (CROM), containing micro-instructions and data, a program counter multiplexer (PCM) to select instructions from the control-read-only-memory (CROM), a micro-instruction decoder and BILBO control (MID/BC), an input test input multiplexer (TIM) to test control signals, an optional status output register (SOR) to generate control signals, and an optional subroutine stack (SS) to allow function calls.

As in the prior-art, this improved on-chip flash EPROM control offers advantages that include:

a) Information density in the control-read-only-memory is high. Therefore, complex program, erase, and compaction instruction are implemented using a relatively small number of control-read-only-memory locations and thus yielding smaller chip size; and b) All control instructions are easily modified by simply changing the microcode contained in the control-read-only-memory and thus providing maximal design flexibility with minimal cost.

The memory control this invention includes a microprogram-read-only-memory containing micro-instructions for operation of an integrated-circuit memory, a program counter multiplexer to select instructions from the control-read-only-memory, a micro-instruction decoder with BILBO control, a test input multiplexer to test control signals, an optional status output register to generate control signals, and a subroutine stack to allow function calls. A program counter takes an index signal from the micro-instruction decoder with BILBO control and a signal from the program counter multiplexer, and from those signal, generates a next microcode address. Complex program, erase, and compaction instructions for the integrated-circuit memory are implemented using a relatively small number of control-read-only-memory locations and using a relatively small surface area on the memory chip. Control instructions are easily modified to compensate for process and structure enhancements are made during the production lifetime of an integrated-circuit memory.

The improved control of this invention is one-third of the size of the prior-art control-read-only-memory. The reduction in size does not degrade the performance or the speed of control operation. This is done by redefining the micro-instruction or microcode syntax and modifying the design of the circuits described in the above-referenced U.S. Pat. No. 5,359,570 and U.S. Pat. No. 5,491,660. Specifically, this invention uses three additional separate sets of latches as compared to circuits described in the referenced patents. However, the number of BILBO SRLs in this invention is reduced to twenty-four from the previous seventy-five. The three sets of latches are primarily used for control signals for programming, erasing and compaction operations.

DETAILED DESCRIPTION OF THE INVENTION

Figure 1:
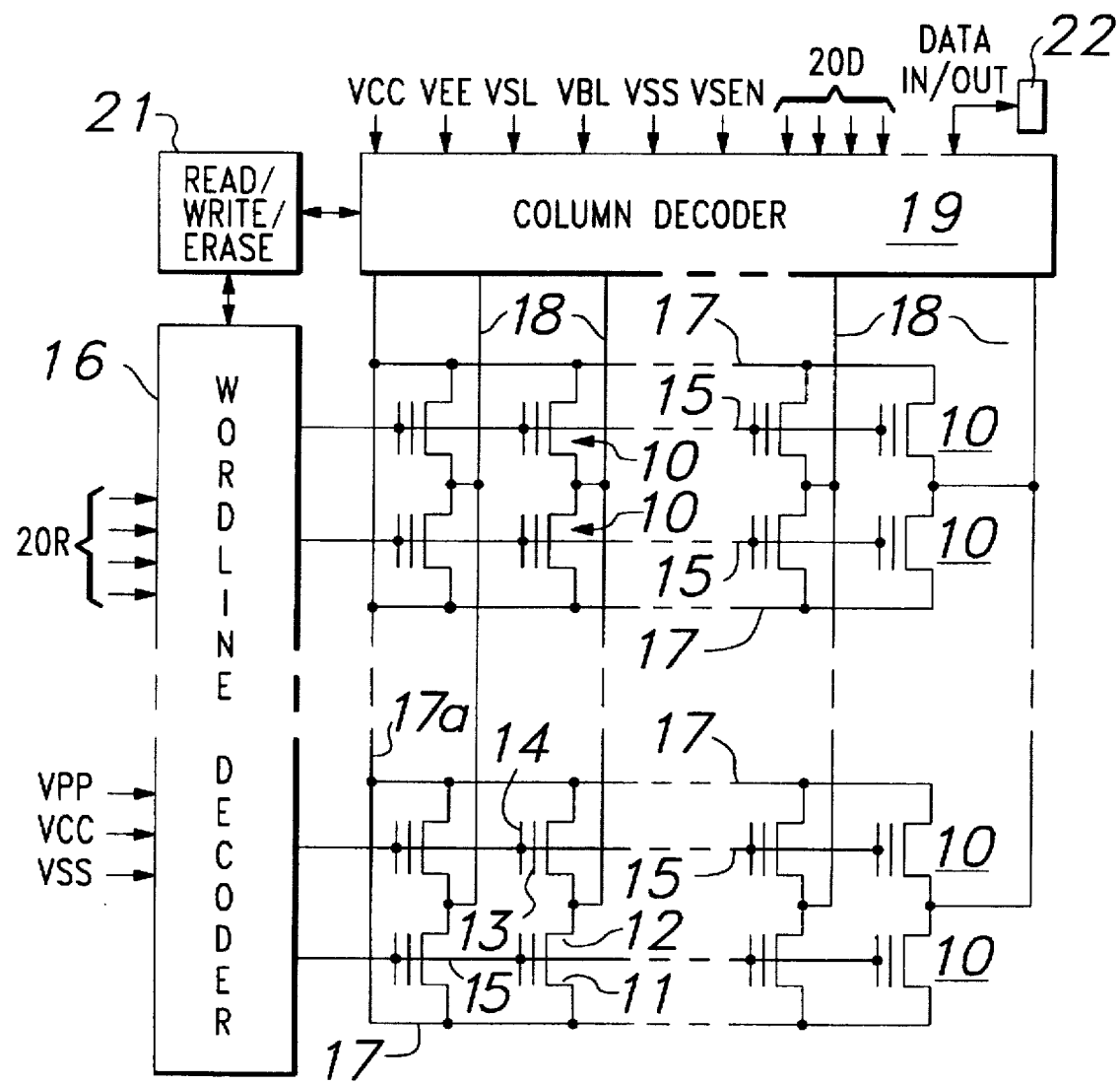
FIG. 1 is an electrical schematic diagram, in partial block form, of a memory cell array.

Referring to FIG. 1, an example array of memory cells 10, which is an integral part of a memory chip, is shown for the purpose of illustrating use of the method and circuitry of this invention. Each cell is a floating-gate transistor 10 having a source 11, a drain 12, a floating gate 13, a control gate 14. Each of the control gates 14 in a row of cells 10 is connected to a wordline 15, and each of the wordlines 15 is connected to a wordline decoder 16. Each of the sources 11 in a row of cells 10 is connected to a source line 17. Each of the drains 12 in a column of cells 10 is connected to a drain-column line 18. Each of the source lines 17 is connected by a common-column line 17a to a column decoder 19 and each of the drain-column lines 18 is connected to the column decoder 19.

In the read mode, the wordline decoder 16 functions, in response to wordline address signals on lines 20R and to signals from Read/Write/Erase control circuit 21 (or external microprocessor 21), to apply a preselected positive voltage VCC (approx. +5 V) to the selected wordline 15, and to apply a low voltage (ground or VSS) to deselected wordlines 15. The column decoder 19 functions to apply a preselected positive voltage VSEN (approx. +1 V) to at least the selected drain-column line 18 and to apply a low voltage (0 V) to the source line 17. The column decoder 19 also functions, in response to signals on address lines 20D, to connect the selected drain-column line 18 of the selected cell 10 to the DATA IN/OUT terminal 22. The conductive or nonconductive state of the cell 10 connected to the selected drain-column line 18 and the selected wordline 15 is detected by a sense amplifier (not shown) connected to the DATA IN/OUT terminal 22.

During a flash-erase mode, the column decoder 19 functions to leave all drain-column lines 18 floating (connected to a high impedance such as field-effect transistor biased in "OFF" condition). The wordline decoder 16 functions to connect all the wordlines 15 to VSS, which may be ground or 0 V. The column decoder 19 also functions to apply a positive voltage VEE (approx. +10 V to +15 V) to all the source lines 17. These erasing voltages create sufficient field strength across the gate oxide region to generate a Fowler-Nordheim tunnel current that transfers charge from the floating gate 13, erasing the memory cell 10. Since the potential on the wordline 15 is at reference voltage VSS, the cell 10 remains in the nonconducting state during erase. Over-erased cells 10 are corrected by one of several compaction procedures.

In a write or program mode, the wordline decoder 16 may function, in response to wordline address signals on lines 20R and to signals from Read/Write/Erase control circuit 21, (or external microprocessor 21) to place a preselected first programming voltage VPP (approx. +12 V) on a selected wordline 15, including a selected control-gate 14. Column decoder 19 also functions to place a second programming voltage VBL (approx. +5 to +10 V) on a selected drain-column line 18 and, therefore, the drain 12 of selected cell 10. Source lines 17 are connected to reference potential VSS, which may be ground. All of the deselected drain-column lines 18 are connected to reference potential VSS or are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately −2 V to −6 V with respect to the channel region (with the control gate 14 at 0 V). For memory cells 10 fabricated in accordance with the example embodiment, the coupling coefficient between a control gate 14/wordline 15 and a floating gate 13 is approximately 0.6. Therefore, a programming voltage VPP of 12 V, for example, on a selected wordline 15, including the selected control gate 14, places a voltage of approximately +7.2 V on the selected floating gate 13. The voltage difference between the floating gate 13 (at approx. +7.2 V) and the grounded (approx. 0 v) source line 17 is insufficient to cause a Fowler-Nordheim tunneling current across the gate oxide between source 11 and floating gate 13 to charge the floating gate 13 of a selected or deselected cell 10. The floating gate 13 of the selected cell 10 is charged with hot electrons injected during programming, and the electrons in turn render the source-drain path under the floating gate 13 of the selected cell 10 nonconductive with +5 V on its control gate 14, a state which is read as a "zero" bit. Non-programmed cells 10 have source-drain paths under the floating gate 13 that are conductive with +5 V on their control gates 14, and those cells 10 are read as "one" bits.

For convenience, a table of read, write and erase voltages is given in TABLE I below:

TABLE I

| Connection\Operation | Read | Flash Erase | Program |
|---|---|---|---|
| Selected Wordline | +5 V | 0 V (All) | +12 V |
| Deselected Wordlines | 0 V | — | 0 V |
| Selected Drain Line | +1 V | Float (All) | +5 V to +10 V |
| Deselected Drain Lines | 0 V or Float | — | Float |
| Source Lines | 0 V | +10 V or +15 V | 0 V |

Figure 2:
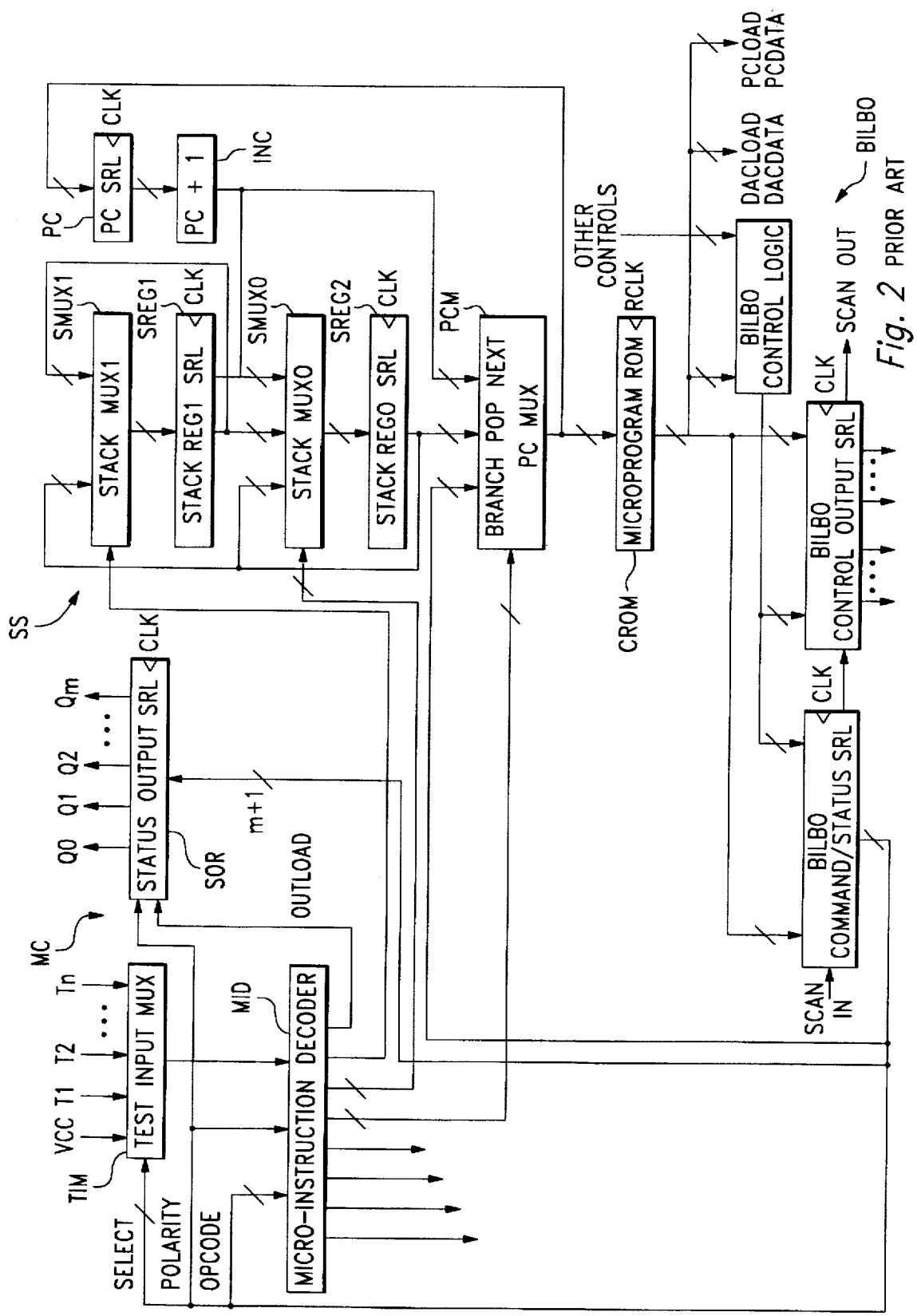
FIG. 2 is a circuit, in block form, illustrating the prior-art control method.
Figure 3:
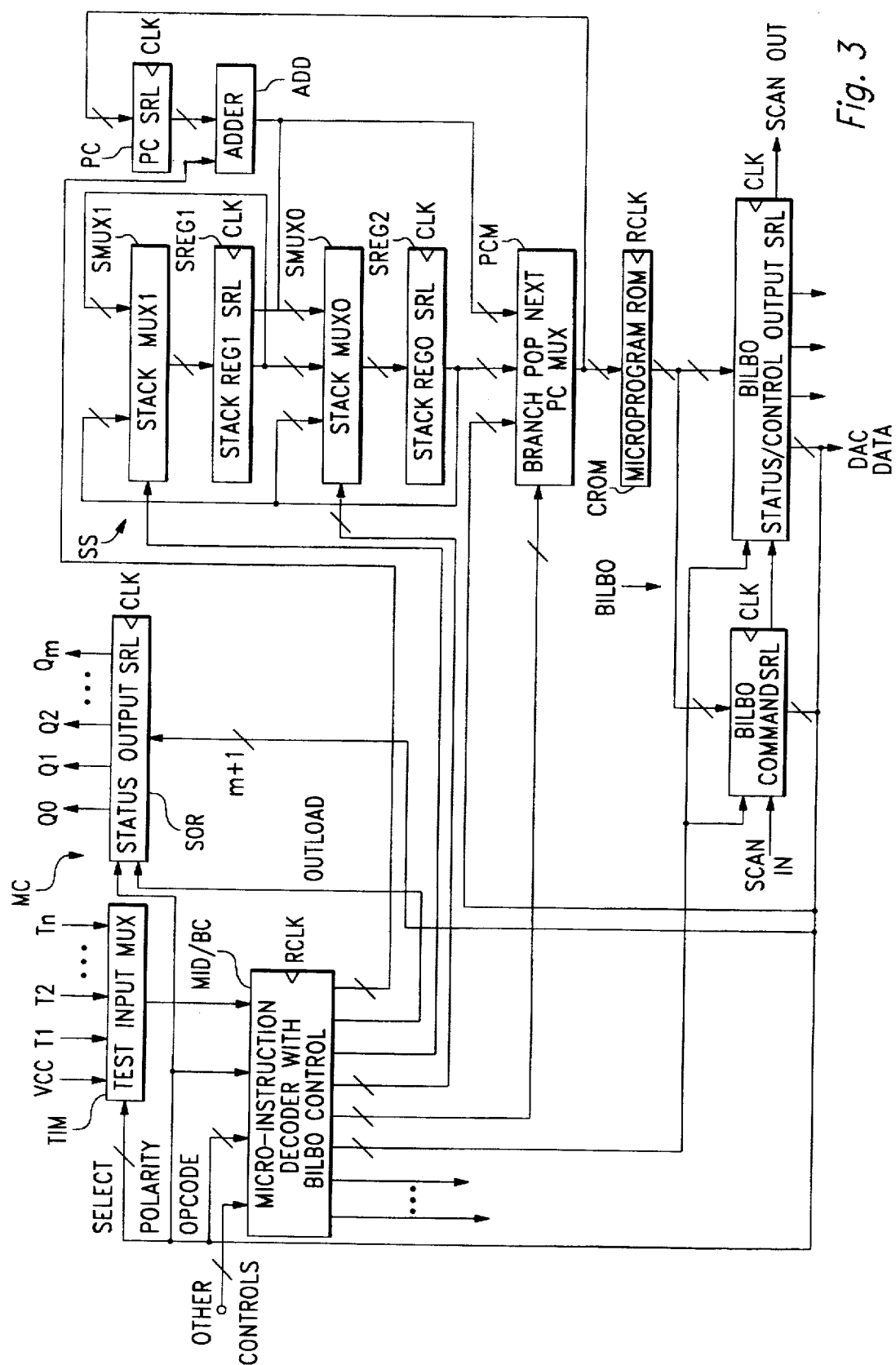
FIG. 3 is a circuit, in block form, illustrating an embodiment of the control method of this invention.

The device of this invention is included in the on-chip part Read/Write/Erase control circuit 21 of FIG. 1. FIG. 2 illustrates, in block diagram form, the prior-art as described in U.S. Pat. No. 5,491,660. FIG. 3 illustrates, also in block diagram form, an embodiment of this invention. The circuit of FIG. 3 includes the following:

A) A Microprogram-Read-Only-Memory or Control-Read-Only-Memory CROM. In this example implementation, the microprogram memory CROM is only a 256×24 array including rows and columns of mask-programmable memory cells as compared to the 256×75 array described in the above-referenced U.S. Pat. No. 5,491,660. In the prior art illustration of FIG. 2, the width of the micro-instruction or microcode is fixed at seventy-five bits, which has the following general "fixed" format or syntax and which is similar to that described in U.S. Pat. No. 5,359,570:

ooopsssssaaaaaaaac . . . c

The seventy-five-bit microcode includes a three-bit opcode field (ooo), a one-bit test condition polarity select field (p), a five-bit field (sssss) for selecting one of thirty-two test inputs, an eight-bit next microcode-address field (aaaaaaaa), and a remaining fifty-eight bit field (c . . . c) for control of internal circuit operation of the flash EPROM of FIG. 1. Since the primary purpose of the microsequencer is simply to supply control signals to operate the flash EPROM, the other fields may be reduced to a minimum in order to decrease the number of codes or ROM bits, and thus chip area. However, due to the "fixed" syntax of the microcodes and the nature of the on-chip operations or algorithms, there are many wasted bits (bits not used for operation control) in the overall codes. In fact, about two-thirds of the program codes of the prior art are used for branching, testing and other controls internal to the microsequencer, leaving only one-third of the programs for actual control of the internal circuit operation of the flash EPROM. In addition, not all of the fifty-eight control bits (actually less than about one-third of the control bits) switch at the same time since all program, erase and compaction operations are completely independent of each other. For example, during programming, only signals for programming operation are switched, while signals for erasing or compaction remain unchanged. Therefore, only one-third of the output field is effectively used, while two-thirds is idle and therefore wasted.

Instead of the seventy-five bit microcode of the prior-art, this invention uses, for example, one of the following variable-syntax, twenty-four bit microcodes to reduce the number of unused ROM bits:

Type A: ooopsssssaaaaaaaaxxxxxx

Type B: ooocccccccccccccccccc

While similar to the syntax used in the prior-art device, the Type A syntax has an extra bit (o) in the opcode field (oooo) to provide compatibility with that prior-art device. The extra bit is necessary for reasons explained later. The "don't care" bit field (xxxxxx) of the Type A syntax is used, for example, as either an optional expanded opcode or as control output signals. The Type B syntax also has a four-bit opcode field (oooo), but has a twenty-bit control output field (c . . . c). Based on the opcode in Type B syntax, a different set of control outputs is programmed for controlling the internal circuit operation of the flash EPROM. To be compatible with the prior-art device, three sets are sufficient. As mentioned previously, because the program, erase and compaction operations are completely independent of each other, the output signals controlling these operations may be sorted into three exclusive groups, each group assigned as one of the three sets defined by the opcode field. Again, since more micro-instructions are added in comparison to the previous invention, an extra bit for opcode field (oooo) is necessary. However, the overall ROM size is reduced by a factor of more than three.

B) A Microsequencer Circuit MC. In this example implementation, the Microsequencer Circuit MC including a Program Counter PC; an Adder ADD; a Program Counter Multiplexer PCM; a Micro-Instruction Decoder and Built-In-Logic-Block-Observation (BILBO) Control MID/BC; a Test Input Multiplexer TIM; a Subroutine Stack SS including a first Stack Multiplexer SMUX1, a first Stack Register SREG1, a second Stack Multiplexer SMUX0, and a second Stack Register SREG0; and an Status Output Register SOR.

The Program Counter PC is reset to zero at the start of each embedded control operation. The Program Counter PC contains the address of the currently addressed microcode word. The construction and operation of such program counters is well-known in this art.

The adder ADD adds the INDEX value generated from MID/BC to the current Program Counter PC value and, from it, generates the next microcode address. The INDEX value depends on the current opcode being decoded and few other external controls such as wait-timer time out status. For example, if the current state is to switch the output signals, then the next address is added by one. If the current state is to turn on the wait-timer and wait, then the next address is added by zero to stay at the current microcode address. As soon as the wait-timer has timed out, the next address is added by one to go to next microcode address. The construction and operation of such adder devices is well-known in this art.

The Program Counter Multiplexer PCM of this example is a three-to-one multiplexer. Under the control of the Micro-Instruction Decoder MID (described in the next paragraph) the Program Counter Multiplexer PCM selects either a field from the current microcode word, the current value of second stack register SREG0, or the incrementer INC as the address into the microprogram memory CROM.

The Micro-Instruction Decoder and BILBO Control MID/BS decodes the operation code field of the microcode word from the Test Input Multiplexer TIM and other inputs and controls the input state of Program Counter Multiplexer PCM, the first Stack Multiplexer SMUX1, the second Stack Multiplexer SMUX0, the Status Output Register SOR, the value added to the next microcode address in the adder ADD, and the BILBO. The RCLK signal used inside this block is only for synchronizing the control signal for the control output in the BILBO. The construction and operation of such decoders is well-known in this art.

The Test Input Multiplexer TIM selects one of n inputs (thirty-one inputs, for example) to test for condition branch instructions. The construction and operation of such multiplexers is well-known in this art.

The Subroutine Stack SS consists of first Stack Multiplexer SMUX1, first Stack Register SREG1, second Stack Multiplexer SMUX0 and second Stack Register SREG0. The Subroutine Stack SS allows nesting of subroutine calls two deep. The construction and operation of such multiplexers and stack, or shift, registers is well-known in this art.

The Status Output Register SOR is, for example, a twenty-bit register whose bits can be set or cleared (there were only thirteen bits in previous art due to a different syntax). The construction and operation of such registers is well-known in this art.

The inputs T1–Tn to the Test Input Multiplexer TIM are test condition inputs from other logic circuitry on the chip, the other logic circuitry being triggered by input from an off-chip microprocessor. The test condition inputs T1–Tn include a reset input, a programmable-timer time-out input, a programmable-counter end-of-count input, a row-address end-of-count input, a column-address end-of-count input, a sector/block end-of-count input, a high-array-source voltage detection input, a data-comparison approval input, a write-request input, a block-protection input, a low-power program-mode input, special-mode input, a checker-board program-mode input, a full-chip-mode-only input, a one-byte-mode-only mode input, a precondition-word-program mode input, a precondition-word-program-verify mode input, an erase-mode input, an erase-verify-mode input, a compaction-mode input, a compaction-verify-mode input, program-option-for-precondition mode input, a number of select-compaction-option mode inputs, a select-autocycle mode input, and a redundant-replacement input for the auto-cycle mode.

In the example circuit of FIG. 3 the outputs of the microprogram memory CROM are connected to special Built-In-Logic-Block-Observation BILBO registers that furnish clock signals and check to see that the information in the microprogram memory is correct. An example of such BILBO circuitry is described in U.S. patent application Ser. No. 08/315,526, filed Sep. 30, 1994, also assigned to Texas Instruments Incorporated. The outputs of the BILBO registers include, for example, outputs indicating activation or deactivation of the high-voltage circuitry on the chip, instruction of the address counter and decoder circuitry, and activation of the data comparison circuitry. Three additional separate sets of latches are used in the circuit of this invention as compared to the previous invention. However, the number of BILBO SRLs used in this invention is reduced to twenty-four from the seventy-five used in the prior art circuit. The three sets of latches are used primarily for the control signals for programming, erasing and compaction operations, respectively.

The outputs from Status Output Register SOR include, for example, outputs for microsequencer status (completed or not), for an overlay block, for program/erase failure, for stop clock oscillator, for select column, for increment sector counter, for timer override, for increment counter, for set-signature test mode, for override pulse timer by external clock, for force row-redundant match, for force column-redundant match, for select bit or byte correction, and for access to overlay block.

This invention is useful for any device that requires embedded control instructions for operation.

While this invention has been described with respect to an illustrative embodiment, this description is not intended to be construed in a limiting sense. In particular, this invention is applicable to use with power supplies having voltage outputs less than three-volt example used herein. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

I claim:

1. A method for controlling operation of a memory array formed on a single integrated-circuit chip in response to microcodes from an external source, said method comprising:

forming a control-read-only-memory on said chip;

programming instructions for performing said operation in said control-read-only-memory; and forming a microsequencer on said chip to perform, in response to said microcodes from said external source, said operation of said memory array according to said instructions programmed in said control-read-only-memory;

said microsequencer including a test multiplexer for receiving microcodes from said external source and for coupling a first signal to an instruction decoder with BILBO control; said instruction decoder with BILBO control also receiving an operation code from said control-read-only-memory, said instruction decoder with BILBO control controlling a subroutine stack and furnishing an index signal; a program counter multiplexer for receiving said operation code, for receiving a second signal from said subroutine stack, and for receiving a third signal from an incrementer, said program counter multiplexer furnishing a fourth signal to said control-read-only memory; and said incrementer taking said fourth signal and said index signal, and from said fourth signal and said index signal, generating said third signal as a next microcode address.

2. The method of claim 1, wherein said operation is writing data into said memory array.

3. The method of claim 1, wherein said operation is erasing data from said memory array.

4. The method of claim 1, wherein said memory array is a nonvolatile memory array.

5. The method of claim 1, wherein said control-read-only memory array is a mask-programmable nonvolatile memory array.

6. The method of claim 1, said subroutine stack further including a first subroutine multiplexer furnishing a fifth signal to a first shift register, said first shift register furnishing a sixth signal to a second subroutine multiplexer, said second subroutine multiplexer furnishing a seventh signal to a second shift register, said second shift register furnishing said second signal to said program counter multiplexer and to said first and second subroutine multiplexers.

7. A circuit for controlling operation of a memory array formed on a single integrated-circuit chip in response to microcodes from an external source, said circuit comprising:

a control-read-only-memory on said chip, said control-read-only-memory storing instructions for performing said operation; and a microsequencer on said chip to perform, in response to said microcodes from said external source, said operation of said memory array according to said instructions programmed in said control-read-only-memory;

said microsequencer including a test multiplexer for receiving microcodes from said external source and for coupling a first signal to an instruction decoder with BILBO control circuitry; said instruction decoder with BILBO control circuitry also receiving an operation code from said control-read-only-memory, said instruction decoder with BILBO control circuitry controlling a subroutine stack and furnishing an index signal; a program-counter multiplexer for receiving a second signal from said subroutine stack and a third signal from an incrementer, said program-counter multiplexer furnishing a fourth signal to said control-read-only-memory; said incrementer taking said fourth signal and said index signal, and from said fourth signal and said index signal, generating said third signal as a next microcode address.

8. The circuit of claim 7, wherein said operation is writing data into said memory array.

9. The circuit of claim 7, wherein said operation is erasing data from said memory array.

10. The circuit of claim 7, wherein said memory array is a nonvolatile memory array.

11. The circuit of claim 7, wherein said control-read-only memory array is a mask-programmable nonvolatile memory array.

12. The circuit of claim 7, said subroutine stack further including a first subroutine multiplexer furnishing a fifth signal to a first shift register, said first shift register furnishing a sixth signal to a second subroutine multiplexer, said second subroutine multiplexer furnishing a seventh signal to a second shift register, said second shift register furnishing said second signal to said program-counter multiplexer and to said first and second subroutine multiplexers.

13. Control means for controlling operation of a memory array formed on a single integrated-circuit chip in response to microcodes from an external source, said means comprising:

control-read-only-memory means on said chip;

programming instructions means on said chip for performing said operation in said control-read-only-memory means; and microsequencer means on said chip to perform, in response to said microcodes from said external source, said operation of said memory array according to said instructions programmed in said control-read-only-memory means;

said microsequencer means including test-multiplexer means for receiving microcodes from said external source and for coupling a first signal to instruction-decoder means with BILBO control; said instruction-decoder means with BILBO control also receiving an operation code from said control-read-only-memory means, said instruction-decoder means with BILBO control controlling subroutine-stack means and furnishing an index signal; program-counter-multiplexer means for receiving said operation code, for receiving a second signal from said subroutine-stack means, and for receiving a third signal from incrementer-means, said program-counter-multiplexer means furnishing a fourth signal to said control-read-only-memory means; and said incrementer means taking said fourth signal from said program-counter-multiplexer means and said index signal from said instruction-decoder means with BILBO control, and from said fourth signal and said index signal, generating said third signal as a next microcode address.

14. The control means of claim 13, said subroutine-stack means further including first-subroutine-multiplexer means furnishing a fifth signal to first-shift-register means, said first-shift-register means furnishing a sixth signal to second-subroutine-multiplexer means, said second-subroutine-multiplexer means furnishing a seventh signal to second-shift-register means, said second-shift-register means furnishing said second signal to said program-counter-multiplexer means and to said first- and second-subroutine-multiplexer means.

* * * * *